United States Patent [19]
Yoshimi et al.

[11] Patent Number: 5,290,721
[45] Date of Patent: Mar. 1, 1994

[54] METHOD OF MAKING A STACKED SEMICONDUCTOR NONVOLATILE MEMORY DEVICE

[75] Inventors: Masanori Yoshimi, Nara; Yoshimitsu Yamauchi, Yamatokooriyama; Kiyoshige Omori, Tenri, all of Japan

[73] Assignee: Sharp Kabushiki Kaisha, Osaka, Japan

[21] Appl. No.: 874,808

[22] Filed: Apr. 28, 1992

[30] Foreign Application Priority Data

Jun. 28, 1991 [JP] Japan .................................. 3-159040

[51] Int. Cl.$^5$ ......................................... H01L 21/266
[52] U.S. Cl. ..................................... 437/43; 437/979; 437/985
[58] Field of Search .................... 437/42, 43, 49, 193, 437/195, 200, 978, 979, 983, 985; 148/DIG. 116, DIG. 163

[56] References Cited

U.S. PATENT DOCUMENTS

| | | | |
|---|---|---|---|
| 3,996,657 | 12/1976 | Simko et al. | 437/43 |
| 5,087,584 | 2/1992 | Wada et al. | 437/43 |
| 5,091,327 | 2/1992 | Bergemont | 437/979 |
| 5,102,814 | 4/1992 | Woo | 437/43 |
| 5,120,670 | 6/1992 | Bergmont | 437/985 |

FOREIGN PATENT DOCUMENTS 0242905  2/1987  Fed. Rep. of Germany ...... 437/979

*Primary Examiner*—Brian E. Hearn
*Assistant Examiner*—C. Chaudhari
*Attorney, Agent, or Firm*—Nixon & Vanderhye

[57] ABSTRACT

This invention is directed to a process for the fabrication of a stacked semiconductor nonvolatile memory device, which process is adapted to define a longitudinal length of a floating gate in self-alignment with overlying control gate and interlayer insulating film by etching, without severely damaging the underlying semiconductor substrate.

11 Claims, 10 Drawing Sheets

METHOD OF MAKING A STACKED SEMICONDUCTOR NONVOLATILE MEMORY DEVICE

FIELD OF THE INVENTION

This invention relates to a process for the fabrication of a semiconductor nonvolatile memory device and, more particularly to a process for the fabrication of a stacked semiconductor nonvolatile memory device, which process is adapted to define a longitudinal length of a floating gate in self-alignment with overlying control gate and interlayer insulating film by etching, without severely damaging the underlying semiconductor substrate.

DESCRIPTION OF THE RELATED ART

A conventional process for fabricating memory devices of the above type is to be described with reference to FIGS. 13–24.

A field oxide 11 is first formed on a silicon substrate 8 by a common technique for device isolation, as shown in FIG. 13. Subsequently, as shown in FIGS. 19 and 20, a gate oxide film L2 ($SiO_2$) as an underlayer for a floating gate is grown to 100 Å thick on the substrate surface by a HCL oxidation technique, followed by the deposition of a first polysilicon layer (first electric conductive layer) to 1500 Å thick. In turn, the first polysilicon layer is doped with a N-type impurity such as of arsenic or phosphorus and then patterned by photolithography to define a width of the floating gate, resulting in a floating gate pattern 13 having a gate width W of 1.2 $\mu$m as shown in FIGS. 19 and 20.

In turn, as shown in FIGS. 21 and 22, an interlayer insulator 14 is grown by thermal oxidation, followed by deposition of a second polysilicon layer (second electric conductive layer) 15 to 3000 Å thick over the entire surface. The second polysilicon layer 15 is then doped with a N-type impurity such as of arsenic or phosphorus. Thereafter, a resist pattern 16 is formed on the second polysilicon layer 15 to define a control gate 17, as shown in FIG. 21. The second polysilicon layer 15, interlayer insulator 14 and underlying floating gate pattern 13 are successively etched, thereby defining a longitudinal length L of the floating gate 18 in a self-aligning manner. Thus, the control gate 17 and floating gate 18 are completed with an interlayer insulating portion 19 being interposed, as shown in FIG. 23.

With the above process, however, the thickness $D_1$ of the interlayer insulator 14 on the floating gate pattern 13 is necessarily larger than the thickness $d_1$ thereof on the gate oxide 12 covering an active region A of the substrate 8 because polysilicon constituting the floating gate pattern 13 is oxidized at a rate higher than the $SiO_2$ growth on the gate oxide 12, as shown in FIG. 22. Accordingly, the silicon substrate 8 is readily eroded in the active region A by etching for forming the control gate 17 and the floating gate 18 at a time, as shown in FIG. 24.

SUMMARY OF THE INVENTION

In view of the foregoing problem, the present invention aims to provide a novel process for the fabrication of a semiconductor nonvolatile memory device, with which method an underlying silicon substrate is hardly eroded when a control gate and a floating gate are successively etched.

Thus, the present invention provides a process for the fabrication of a semiconductor nonvolatile memory device, which comprises the steps of:

(i) depositing on the entire surface of a semiconductor substrate having a gate oxide film a first electric conductive layer intended to be a floating gate and patterning the first electric conductive film with use of a resist pattern to form a floating gate pattern having a width of the floating gate;

(ii) forming an interlayer insulating film by a partially accelerated oxidation such that the thickness thereof on an active region of the semiconductor substrate is larger than that on the floating gate pattern, the partially accelerated oxidation comprising implanting impurity ions into the active region having the gate oxide film thereon and subjecting the thus treated substrate to a thermal oxidation;

(iii) stacking on the entire surface of the interlayer insulating film a second electric conductive layer intended to be a control gate and a photoresist film sequentially and patterning the photoresist film to form a mask for the control gate; and (iv) etching the second electric conductive layer, the interlayer insulating film and the floating gate pattern successively with use of the mask to form the control gate as well as to define a longitudinal length of the floating gate in self-alignment with the control gate.

DETAILED DESCRIPTION OF THE PREFERRED EMBODIMENTS

The process of the present invention is designed to differentiate the thickness of an interlayer insulating film, which electrically insulates a control gate (CG) from a floating gate (FG), between that on a floating gate pattern (FG pattern) of which width (gate width W) is already defined and that on an active region of a substrate. More specifically, the thickness of the interlayer insulating film on the active region of the substrate is made larger than that on the FG pattern by a partially accelerated oxidation technique, whereby the substrate is prevented from erosion due to etching for forming the control gate and the floating gate.

Figure 10:
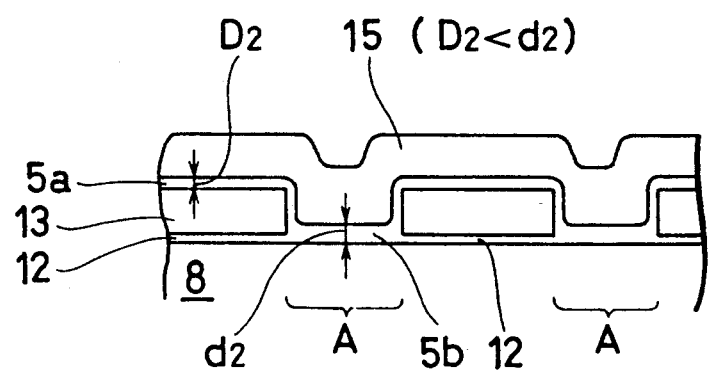
FIG. 10 is a schematic section taken along VI—VI line in FIG. 3.

Described with reference to FIG. 10, an interlayer insulating film 5 covers the entire surface of a semiconductor substrate 8 including a FG pattern 13 and an active region A, and the thickness $d_2$ of the interlayer insulating film 5b on the active region A is made larger than the thickness $D_2$ of the interlayer insulating film 5a on the FG pattern 13 by the partially accelerated oxidation technique. For example, the thickness $d_2$ is set to 700 Å, while the thickness $D_2$ is set to 600 Å.

In the present invention the interlayer insulating film is made of an ONO (oxide-Nitride-Oxide) film or $SiO_2$ film. The partially accelerated oxidation includes steps of doping a predetermined region of the substrate, i.e., the active region and the gate oxide film thereon, with an impurity such as of As or P in a high dose of $5 \times 10^{20}$ to $9 \times 10^{20}$ ions/cm$^2$ and subjecting the substrate to thermal oxidation, whereby an oxide film is grown on the predetermined region to a thickness larger than that on the polysilicon layer (FG pattern). In a preferred embodiment of the invention, arsenic ions are implanted into the active region A as well as the gate oxide thereon in a dose of $5 \times 10^{20}$ ions/cm$^2$, and the substrate undergoes steam oxidation at 1050° C. This results in a $SiO_2$ film (5b) having a thickness $d_2$ of 700 Å.

In the theory of the partially accelerated oxidation, there is an equation: $dox^2(t) + A \cdot dox(t) = B(t + t_o)$, where $dox(t)$ is a target film thickness, A and B are each an oxidation rate constant, and $t_o$ is complementary time. A and B are found by the equations: $A = (-P_{O2}) \times (Kp)/(K1)$ and $B = (P_{O2}) \times (Kp)$, respectively. In these equations, K1 is a linear rate constant, Kp is a parabolic rate constant, and $P_{O2}$ is a normalized partial pressure. Kp and K1 are determined only by the oxidation atmosphere and crystal orientation of the substrate when the substrate is doped with an impurity in a low dose, while Kp and K1 increase when the substrate is doped in a high dose. Accordingly, an oxide film obtained by the partially accelerated oxidation has a thickness dox larger than that obtained under the same conditions but not by the partially accelerated oxidation. Thus, a relatively thick interlayer insulating film is formed on the active region of the substrate, while a relatively thin interlayer insulating film is formed on the FG pattern.

In the present invention the upper polysilicon layer 15 (second conductive layer) for a control gate, the interlayer insulating film (5a and 5b) of $SiO_2$ and the FG pattern 13 (first conductive layer) Of the lower polysilicon layer are successively etched under known conditions. The first and second conductive layers are preferably made of polysilicon. As the second conductive layer may be used a polycide of $WSi_x$/polysilicon. In addition the present invention uses a known ion implantation technique.

A fabrication process embodied according to the invention is now described in sequence with reference to FIGS. 1-12.

Figure 1:
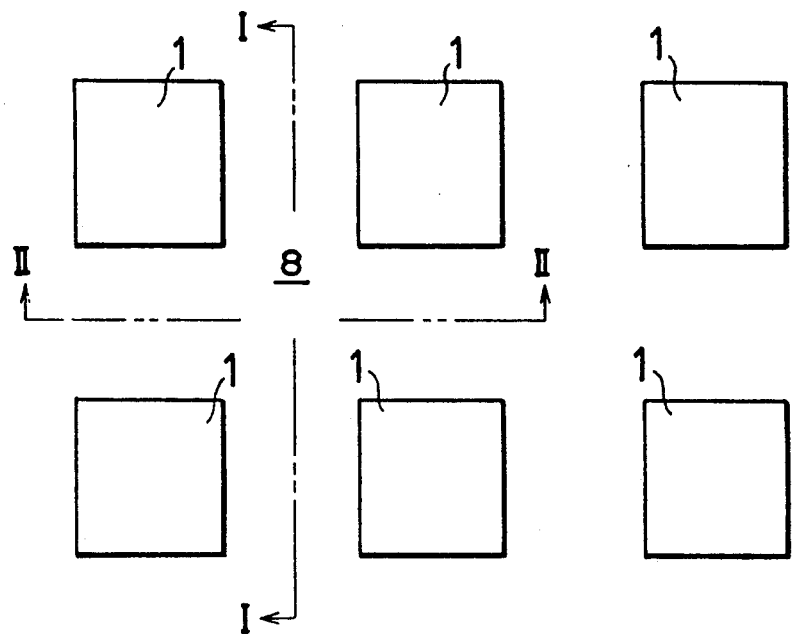
FIG. 1 is an explanatory view schematically illustrating a first step of a fabrication process in an embodiment according to the invention.
Figure 2:
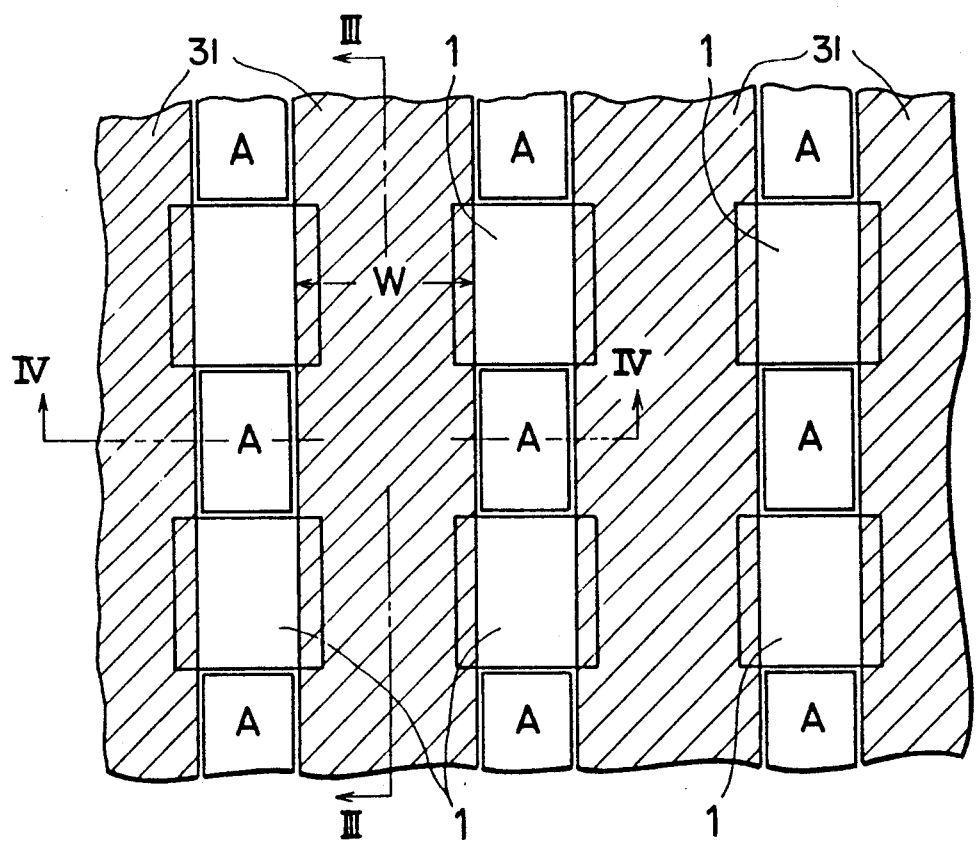
FIG. 2 is also an explanatory view schematically illustrating a second step of the fabrication process in the embodiment.
Figure 3:
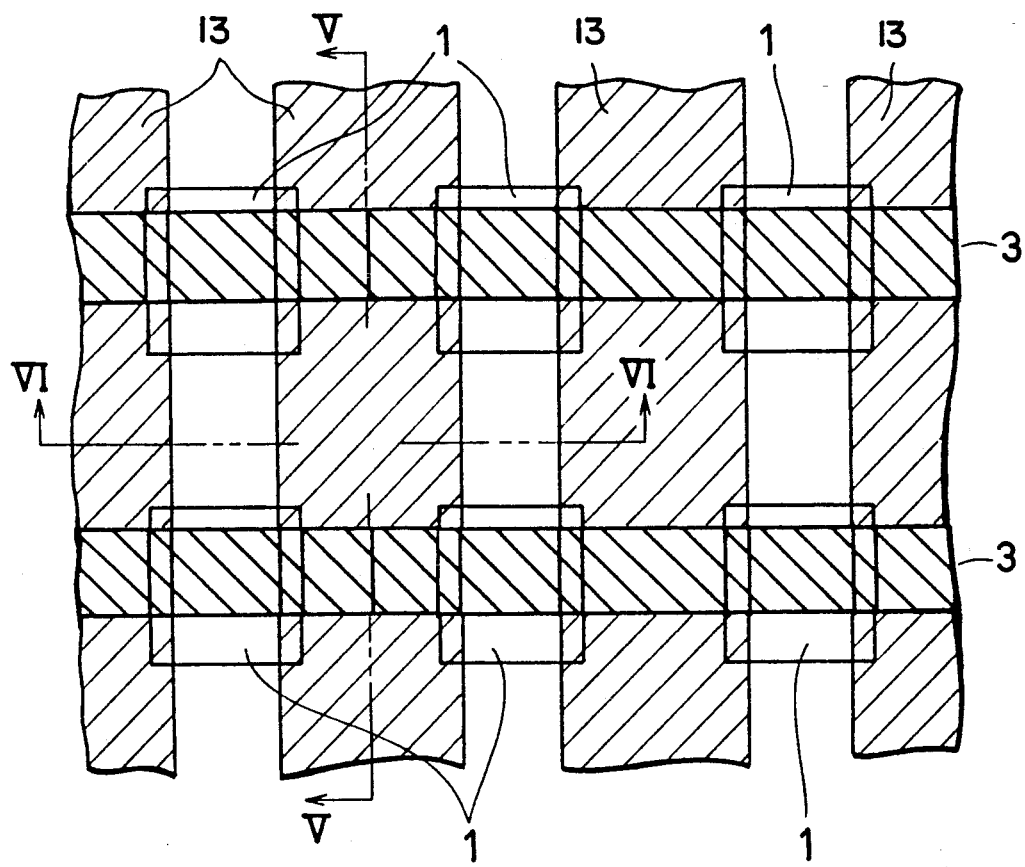
FIG. 3 is also an explanatory view schematically illustrating a third step of the fabrication process in the embodiment.
Figure 4:
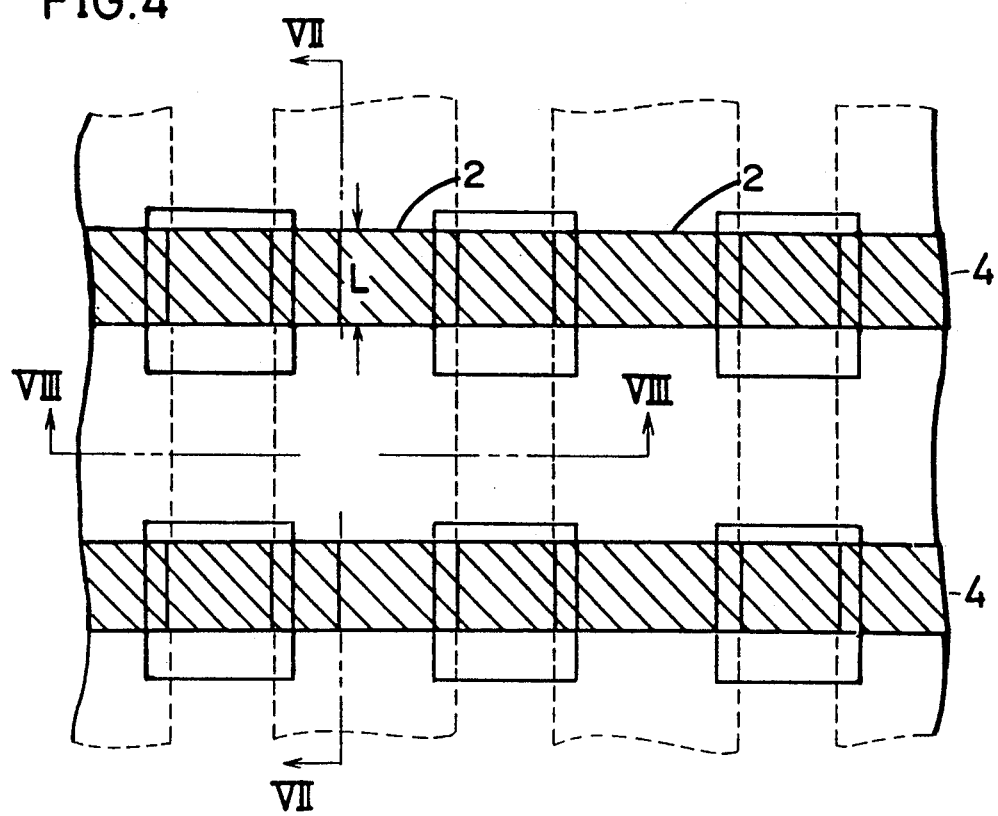
FIG. 4 is also an explanatory view schematically illustrating a fourth step of the fabrication process in the embodiment.
Figure 5:
FIG. 5 is a schematic section taken along I—I line in FIG. 1.
Figure 6:
FIG. 6 is a schematic section taken along II—II line in FIG. 1.
Figure 7:
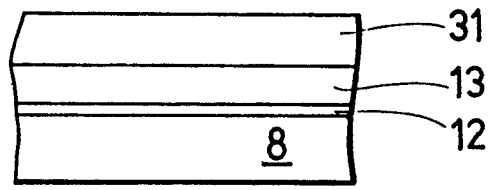
FIG. 7 is a schematic section taken along III—III line in FIG. 2.
Figure 8:
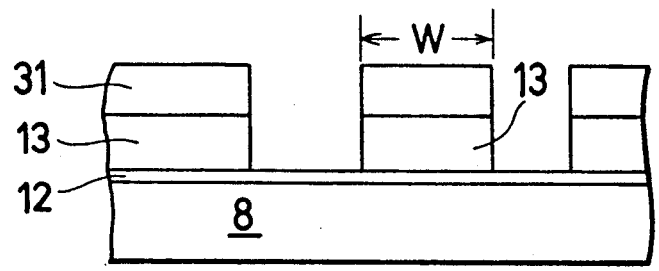
FIG. 8 is a schematic section taken along IV—IV line in FIG. 2.

A field oxide 1 is first formed on a silicon substrate 8 for device isolation by a common technique, as shown in FIG. 1. Subsequently, as shown in FIGS. 7 and 8, a gate oxide film 12 ($SiO_2$) on which a floating gate is to be formed later is grown to 100 Å thick on the substrate surface by a HCL oxidation technique, followed by the deposition of a first polysilicon layer (first electric conductive layer) to 1500 Å thick over the entire substrate. In turn, the first polysilicon layer is doped with a N-type impurity such as of arsenic or phosphorus and then patterned by photolithography with use of a resist pattern 31 to define a width of the flouting gate (refer to FIG. 2), resulting in a floating gate pattern 13 having a gate width W of the floating gate [see FIGS. 7 and 8].

Figure 9:
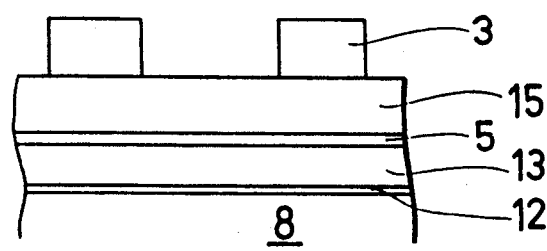
FIG. 9 is a schematic section taken along V—V line in FIG. 3.
Figure 11:
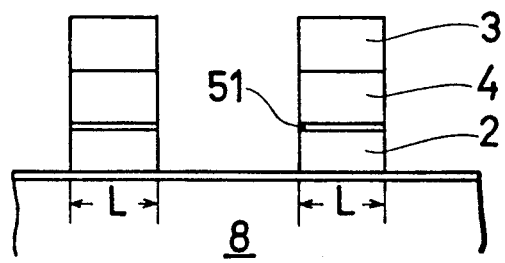
FIG. 11 is a schematic section taken along VII—VII line in FIG. 4.
Figure 12:
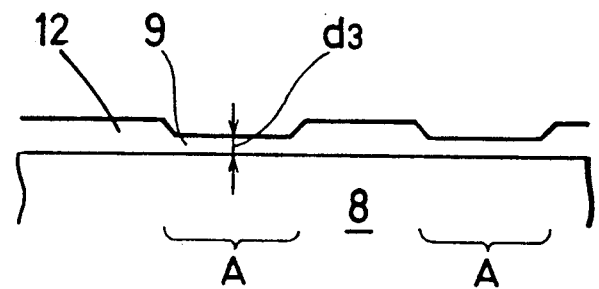
FIG. 12 is a schematic section taken along VIII—VIII line in FIG. 4.
Figure 13:
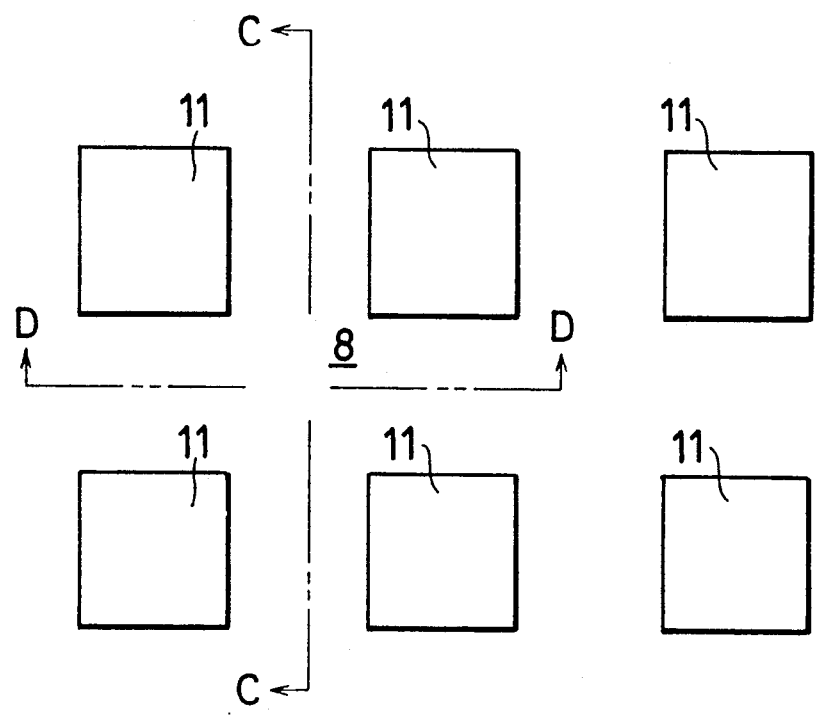
FIG. 13 is an explanatory view schematically illustrating a first step of a conventional fabrication process.
Figure 14:
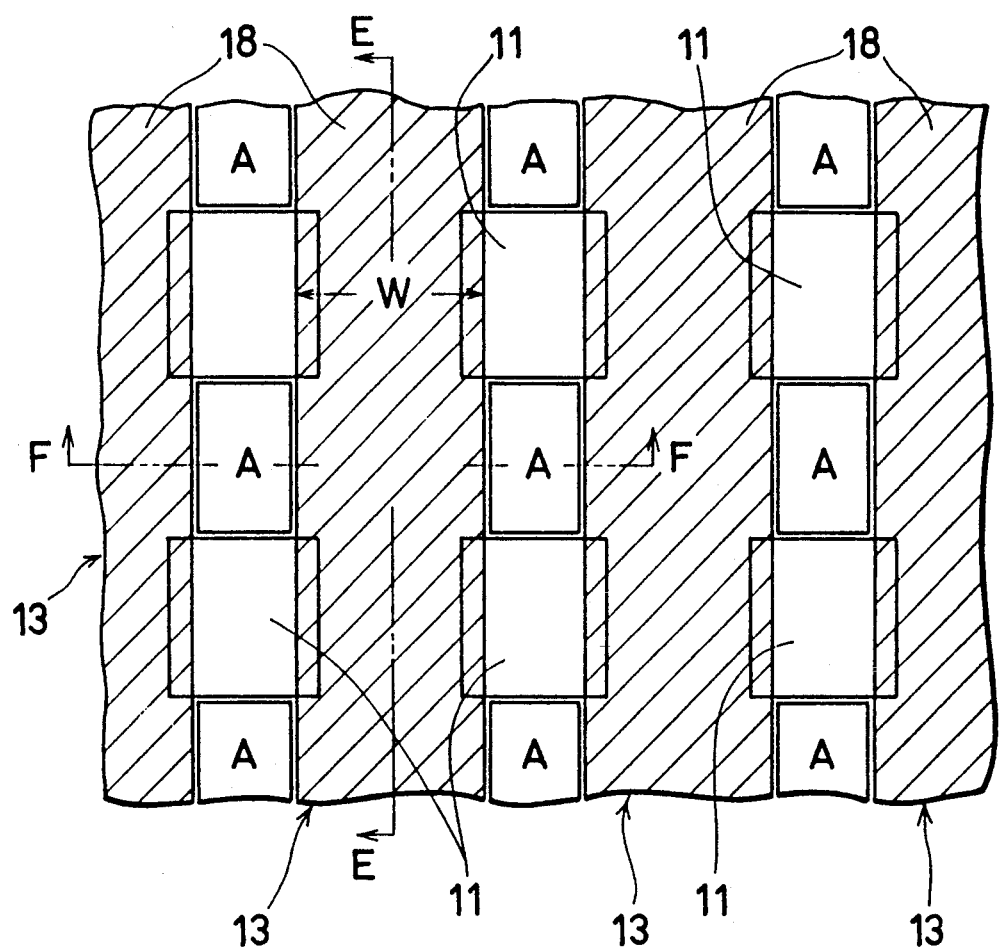
FIG. 14 is also an explanatory view schematically illustrating a second step of the conventional fabrication process.
Figure 15:
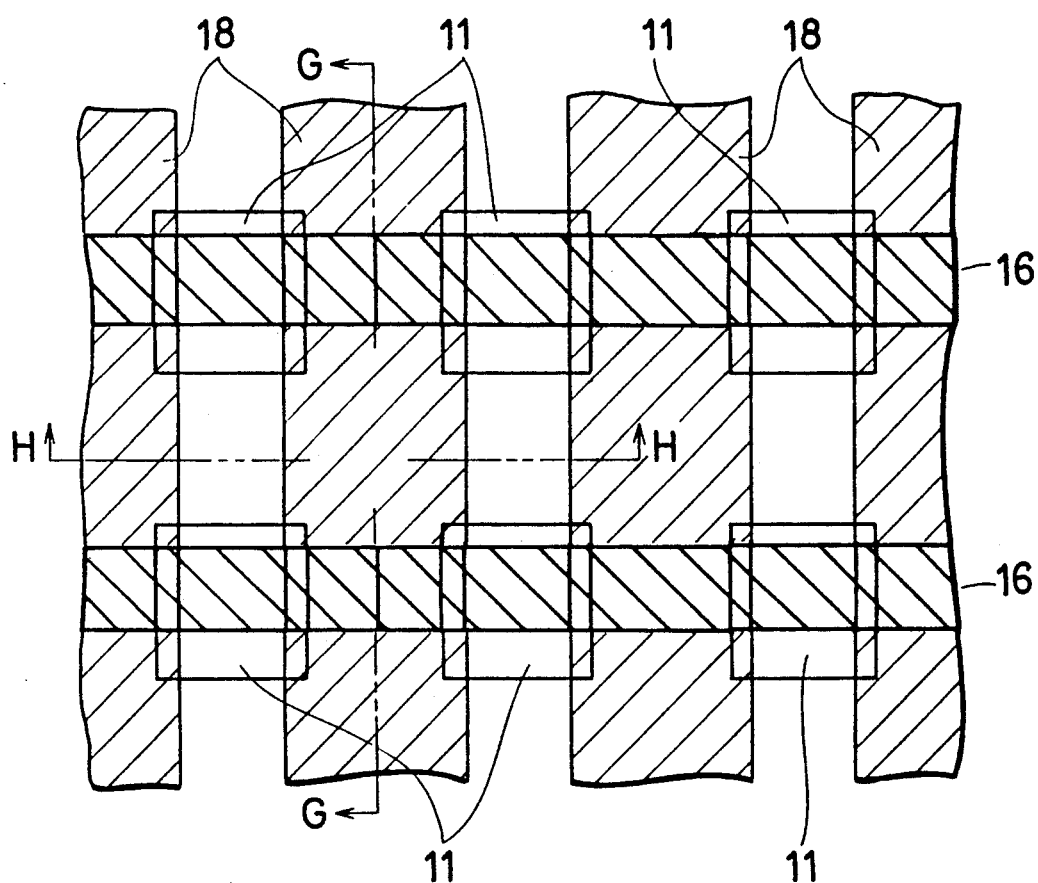
FIG. 15 is also an explanatory view schematically illustrating a third step of the conventional fabrication process.
Figure 16:
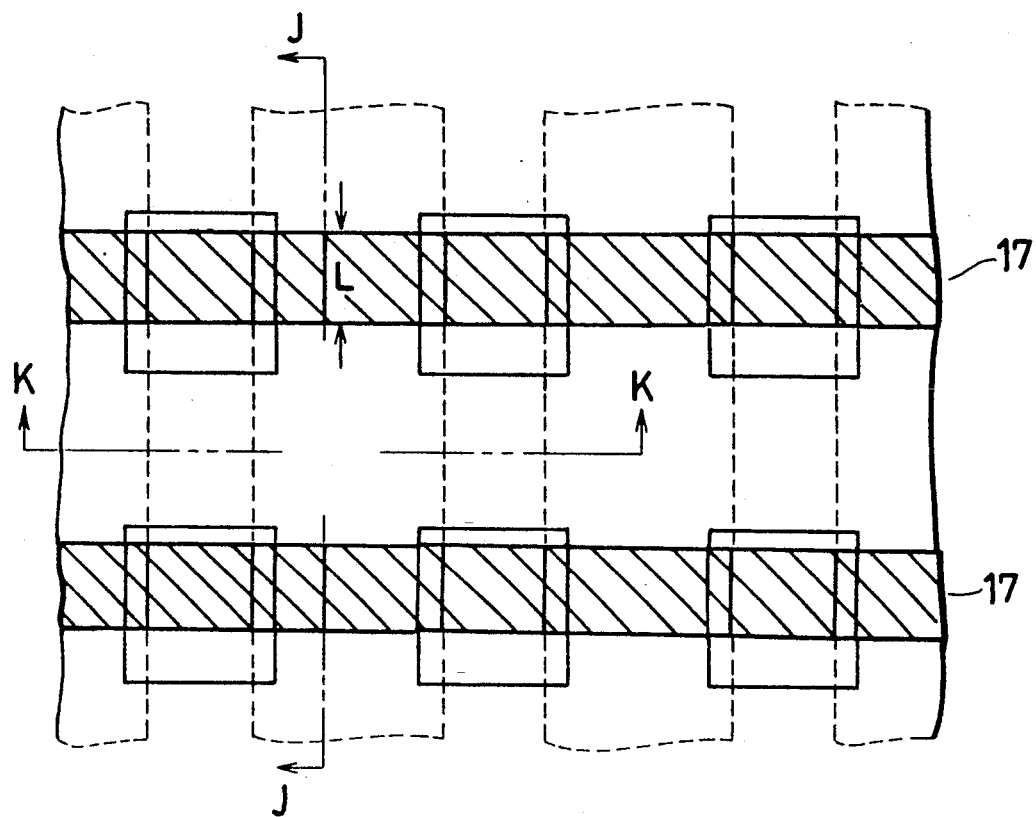
FIG. 16 is also an explanatory view schematically illustrating a fourth step of the conventional fabrication process.
Figure 17:
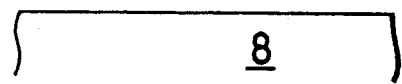
FIG. 17 is a schematic section taken along C—C line in FIG. 13.
Figure 18:
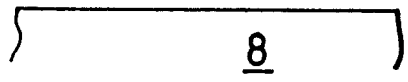
FIG. 18 is a schematic section taken along D—D line in FIG. 13.
Figure 19:
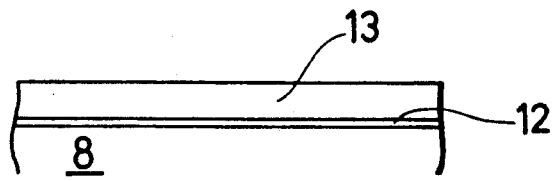
FIG. 19 is a schematic section taken along E—E line in FIG. 14.
Figure 20:
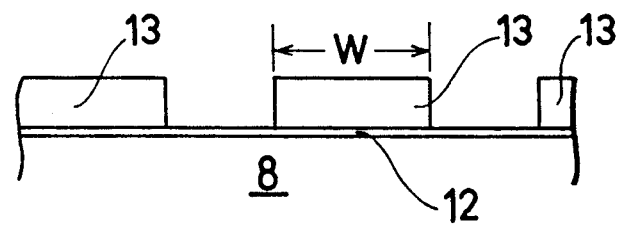
FIG. 20 is a schematic section taken along F—F line in FIG. 14.
Figure 21:
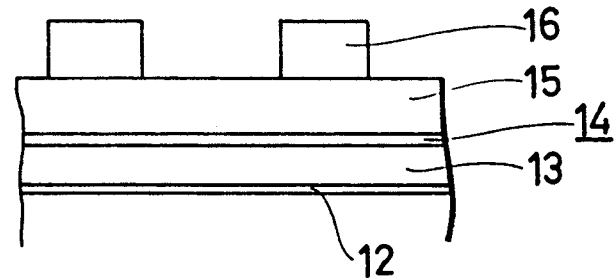
FIG. 21 is a schematic section taken along G—G line in FIG. 15.
Figure 22:
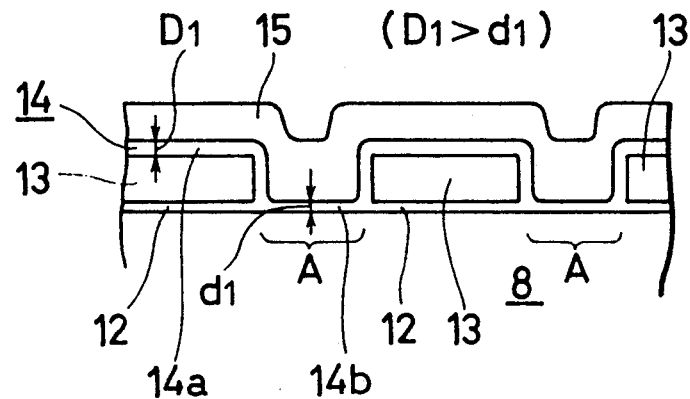
FIG. 22 is a schematic section taken along H—H line in FIG. 15.
Figure 23:
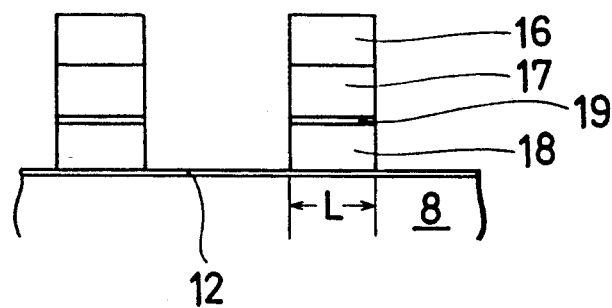
FIG. 23 is a schematic section taken along J—J line in FIG. 16.
Figure 24:
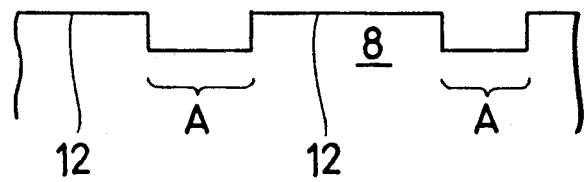
FIG. 24 is a schematic section taken along K—K line in FIG. 16.

After removal of the resist pattern 31, a $SiO_2$ layer becoming an interlayer insulating film 5 later is grown by thermal oxidation [see FIG. 9]. In this case, an active region A of the substrate and the $SiO_2$ layer existing thereon is then doped with arsenic ions in a high dose of $5 \times 10^{20}$ ions/cm$^2$. In turn the substrate is subjected to a steam oxidation at 1050° C. to form the interlayer insulating film 5 including a thin portion 5a having a thickness $D_2$ of 600 Å on the FG pattern 13 and a thick portion 5b having a thickness $d_2$ of 700 Å. Subsequently, a second polysilicon layer 15 (second electric conductive layer) is deposited to 3000 Å thick over the entire surface of the substrate, followed by being doped with a N-type impurity such as of arsenic or phosphorus by a known method. Thereafter, a resist pattern 3 is formed on the second polysilicon layer 15 to define a control gate 4 shown in FIG. 9. The second polysilicon layer 15, interlayer insulating film 5 and underlying floating gate pattern 13 are successively etched by a dry etching. As a result, a longitudinal length (gate length L) of the floating gate 2 is defined in a self-aligning manner. Thus, the control gate 4 and floating gate 2 are completed with an interlayer insulating portion 51 being interposed, as shown in FIG. 11. In this case the gate oxide film 12 and a thermal oxide film 9 having a thickness $d_3$ of 20-40 Å are retained on the active region A of the substrate 8 [see FIG. 12]. Note that the successive dry etching as conducted herein is realized by combining known etching techniques.

According to the present embodiment, at the time etching to the second polysilicon layer and the interlayer insulating film is completed, the oxide film 9 is sufficiently retained with a thickness of 80-100 Å. Accordingly, the active region of the substrate will not be eroded even when the first polysilicon layer is successively etched. Therefore, increase in leakage current at junction and incomplete conduction of a bit line because of eroded substrate can be prevented.

As has been described, the process for the fabrication of a stacked nonvolatile memory device according to the invention is designed to prevent a substrate from being eroded by etching carried out to form a control gate and floating gate, by forming a thick interlayer insulating film on an active region of the substrate with use of partially accelerated oxidation. By virtue of the invention, drawbacks attributable to the prior arts such as increase in leakage current and incomplete conduction of a bit line can be prevented.

What is claimed is:

1. A process for the fabrication of a semiconductor nonvolatile memory device, which comprises the steps of:
    (1) depositing, on a surface of a semiconductor substrate having a gate oxide film, a first electric conductive layer intended to be a floating gate and patterning said first electric conductive layer with a resist pattern to form a floating gate pattern having a restricted width;
    (ii) forming an interlayer insulating film by a partially accelerated oxidation such that the thickness thereof on an active region of said semiconductor substrate is larger than that on said floating gate pattern, said partially accelerated oxidation comprising implanting impurity ions into said active region using said floating gate pattern and said gate oxide film thereunder as a mask and subjecting the thus treated substrate to a thermal oxidation;
    (iii) sequentially forming on the surface of said interlayer insulating film a second electric conductive layer intended to be a control gate and a photoresist film and patterning said photoresist film to form a mask for the control gate; and
    (iv) etching said second electric conductive layer, said interlayer insulating film and said floating gate pattern successively with use of said mask to form the control gate as well as to define a longitudinal length of the floating gate in self-alignment with said control gate.

2. A process as set forth in claim 1, wherein said first electric conductive layer and said second electric conductive layer are made of polysilicon or polycide of WSix/polysilicon.

3. A process as set forth in claim 1, wherein said interlayer insulating film has a thickness of about 700 Å on said active region and a thickness of about 600 Å on said floating gate pattern.

4. A process as set forth in claim 1, wherein the impurity ions are of arsenic or phosphorus.

5. A process as set forth in claim 1, wherein the impurity ions are implanted in a dose of $5 \times 10^{20}$ ions/cm$^2$ to $9 \times 10^{20}$ ions/cm$^2$.

6. A process as set forth in claim 1, wherein said thermal oxidation comprises a steam oxidation.

7. A process for manufacturing a semiconductor device comprising the steps of:
    i) depositing a gate oxide film on a semiconductor substrate;
    ii) forming a first electrically conductive layer on said gate oxide film;
    iii) forming a floating gate pattern of a restricted width by patterning the first electrically conductive layer;
    iv) forming an interlayer insulating film on the semiconductor substrate including the floating gate pattern by, the step of forming the interlayer insulating film comprising:
        a) implanting impurity ions into the substrate at a predetermined active region not including where the floating gate pattern is formed; and,
        b) subjecting the substrate to a thermal oxidation;
    whereby the interlayer insulating film is essentially simultaneously formed over both the predetermined active region and the floating gate pattern, and whereby the interlayer insulating film has a greater thickness over the predetermined active region than over the floating gate pattern;
    v) depositing a second electrically conductive layer on said interlayer insulating film;
    vi) forming a pattern on the second electrically conductive layer for forming a control gate in the second electrically conductive layer and a floating gate in the first electrically conductive layer.

8. A process as set forth in claim 7, wherein the control gate and the floating gate are self-aligned.

9. A process as set forth in claim 8, wherein the control gate and the floating gate are formed simultaneously.

10. A process as set forth in claim 7, wherein, as a result of forming the interlayer insulating film with a greater thickness on the semiconductor substrate, the substrate is not etched in the step of forming the control gate and the floating gate.

11. A process as set forth in claim 7, further comprising the subsequent steps of:
    providing a photoresist over the second electrically conductive layer;
    etching the second electrically conductive layer to define a longitudinal length of the floating gate in selfalignment with the control gate.

* * * * *